US006489827B1

(12) United States Patent
Sutardja

(10) Patent No.: US 6,489,827 B1
(45) Date of Patent: Dec. 3, 2002

(54) REDUCTION OF OFFSET VOLTAGE IN CURRENT MIRROR CIRCUIT

(75) Inventor: Sehat Sutardja, Cupertino, CA (US)

(73) Assignee: Marvell International, Ltd., Hamilton (BM)

( * ) Notice: Subject to any disclaimer, the term of this patent is extended or adjusted under 35 U.S.C. 154(b) by 0 days.

(21) Appl. No.: 09/698,236

(22) Filed: Oct. 30, 2000

(51) Int. Cl.$^{7}$ .................................................. H03L 5/00
(52) U.S. Cl. ....................................... 327/307; 327/543
(58) Field of Search ................................ 327/538, 540, 327/541, 543, 307; 323/315

(56) References Cited

U.S. PATENT DOCUMENTS

| | | | | | |
|---|---|---|---|---|---|
| 4,831,323 | A | * | 5/1989 | Melbert | 323/315 |
| 5,015,942 | A | * | 5/1991 | Kolanko | 323/315 |
| 5,410,242 | A | * | 4/1995 | Bittner | 323/315 |
| 5,486,787 | A | * | 1/1996 | Maekawa et al. | 327/543 |
| 5,523,717 | A | * | 6/1996 | Kimura | 327/359 |
| 5,545,973 | A | * | 8/1996 | Johnson | 323/315 |
| 5,672,960 | A | * | 9/1997 | Manaresi et al. | 323/315 |
| 5,757,230 | A | * | 5/1998 | Mangelsdorf | 33/133 |
| 5,793,239 | A | * | 8/1998 | Kovacs et al. | 327/262 |
| 5,945,873 | A | | 8/1999 | Antone et al. | 327/541 |
| 6,034,518 | A | | 3/2000 | Yuasa | 323/316 |
| 6,087,819 | A | | 7/2000 | Kuroda | 323/315 |
| 6,118,395 | A | | 9/2000 | Kim | 341/135 |
| 6,124,705 | A | | 9/2000 | Kwong | 323/316 |
| 6,127,841 | A | | 10/2000 | Roohparvar | 326/34 |
| 6,172,556 | B1 | * | 1/2001 | Prentice | 327/543 |

* cited by examiner

*Primary Examiner*—Terry D. Cunningham
(74) *Attorney, Agent, or Firm*—Eric B. Janofsky; Katten Muchin Zavis Rosenman

(57) ABSTRACT

A current mirror includes at least two pairs of metal oxide semiconductor field effect transistors (MOSFETs), preferably manufactured using complementary metal oxide semiconductor (CMOS) technology. Each MOSFET includes a gate, a source, and a drain, and each MOSFET operates according to a set of characteristic curves, wherein each curve includes a linear region and a saturation region. Each pair of MOSFETs is configured in series. A first current passes through the first pair of MOSFETs, and a second current passes through the second pair of MOSFETs. The first MOSFET of the first pair is electrically connected to the first MOSFET of the second pair, and the second MOSFET of the first pair is electrically connected to the second MOSFET of the second pair. A voltage difference between the first MOSFET of the first pair and the first MOSFET of the second pair is a first offset voltage, and a voltage difference between the second MOSFET of the first pair and the second MOSFET of the second pair is a second offset voltage. The second offset voltage is reduced by simultaneously operating the second MOSFET of the first pair in the linear region of one of its characteristic curves and operating the second MOSFET of the second pair in the linear region of one of its characteristic curves.

25 Claims, 4 Drawing Sheets

REDUCTION OF OFFSET VOLTAGE IN CURRENT MIRROR CIRCUIT

BACKGROUND OF THE INVENTION

1. Field of the Invention

The present invention relates to an apparatus and a method for reducing offset voltage in a current mirror, thereby enabling the two currents being "mirrored" to more closely match one another, and, as a direct result, improving the performance of circuits that use a current mirror as a component.

2. Description of the Related Art

As is well known in the art, current sources are widely used in microelectronic circuitry as biasing elements and as load devices for various types of amplifier stages. As is also well known, such use of current sources in biasing arrangements proves advantageous in the superior insensitivity of circuit performance to power supply variations and to changes in temperature which are often present. When used as a load element in transistor amplifier stages, furthermore, the high incremental resistance exhibited by the current source leads to high voltage gains at low power supply voltages. Because of these characteristics, a desirable application for a current source is in the digital-to-analog converter. In such uses, a current mirror employing metal-oxide-semiconductor field effect transistors (MOSFETs) is commonly employed, offering an accurate reproduction of the reference current. Current mirrors are very well known in the literature and are the subject of many patents. For example, see U.S. Pat. Nos. 6,127,841; 6,124,705; 6,118,395; 6,087,819; 6,034,518; and 5,945,873, the contents of each of which are hereby incorporated by reference.

Referring to FIG. 1, a circuit diagram for a current mirror 100 uses four MOSFETs 105, 110, 115, 120 and a current source 125. Ideally, the current $I_1$ passing through MOSFETs 105 and 110 on the left half of the current mirror is equal to the current $I_2$ passing through MOSFETs 115 and 120 on the right half of the current mirror (hence, the term "mirror").

However, $I_1 \neq I_2$, due to what are known in the art as secondary effects. Even when transistors are designed to be identical to each other, there are always slight differences, caused by minor manufacturing variations or defects. Such variations are more pronounced when the transistors use very small geometries. Referring to FIG. 2, this phenomenon is represented in a circuit diagram in which a small offset voltage $V_{offset1}$ 205 between MOSFET 105 and MOSFET 115 is a voltage difference between the two halves of the current mirror. This offset voltage 205 results in a difference between the currents $I_1$ and $I_2$. A similar small offset voltage $V_{offset2}$ exists between MOSFET 110 and MOSFET 120. Atypical range of values for an offset voltage is approximately 10–50 mV.

The magnitudes of the offset voltages are inversely proportional to the areas of the respective transistors. Thus, the smaller the transistor, the larger the offset voltage. One method of reducing the offset voltage would be to use larger transistors. However, this method has drawbacks. One drawback is that a larger transistor area also directly results in a larger source-to-gate capacitance. Capacitance is inversely proportional to frequency, which is directly related to the speed of the circuit. Hence, if a transistor having a larger area is used in order to reduce the offset voltage, the entire circuit is forced to operate more slowly.

SUMMARY OF THE INVENTION

The present invention is intended to overcome the drawbacks noted above and provides a current mirror with reduced offset voltage while maintaining overall system performance and speed.

According to one aspect of the present invention, a current mirror includes at least two pairs of metal oxide semiconductor field effect transistors (MOSFETs). Each MOSFET includes a gate, a source, and a drain, and each MOSFET operates according to a set of characteristic curves, wherein each curve includes a linear region and a saturation region. Each pair of MOSFETs is configured in series. A first current passes through the first pair of MOSFETs, and a second current passes through the second pair of MOSFETs. The first MOSFET of the first pair is electrically connected to the first MOSFET of the second pair, and the second MOSFET of the first pair is electrically connected to the second MOSFET of the second pair. A voltage difference between the first MOSFET of the first pair and the first MOSFET of the second pair is a first offset voltage, and a voltage difference between the second MOSFET of the first pair and the second MOSFET of the second pair is a second offset voltage. The second offset voltage is reduced by simultaneously operating the second MOSFET of the first pair in the linear region of one of its characteristic curves and operating the second MOSFET of the second pair in the linear region of one of its characteristic curves.

The current mirror may be implemented as part of a read channel for a hard disk drive, or as a biasing element in a larger electrical circuit. It may be used as an operational amplifier or as an analog-to-digital converter. A method for reducing offset voltage in a current mirror circuit may also be realized.

DETAILED DESCRIPTION OF THE INVENTION

The present invention will be described with respect to a current mirror device including at least four metal oxide semiconductor field effect transistors (MOSFETs). It is noted that the best mode of the present invention involves the use of complementary metal oxide semiconductor (CMOS) technology in the manufacture of the MOSFET. However, the invention may also be applied to other types of MOSFETs and other method of manufacturing MOSFETs. Additionally, the invention may also be applied to FETs other than MOSFETs.

Figure 1:
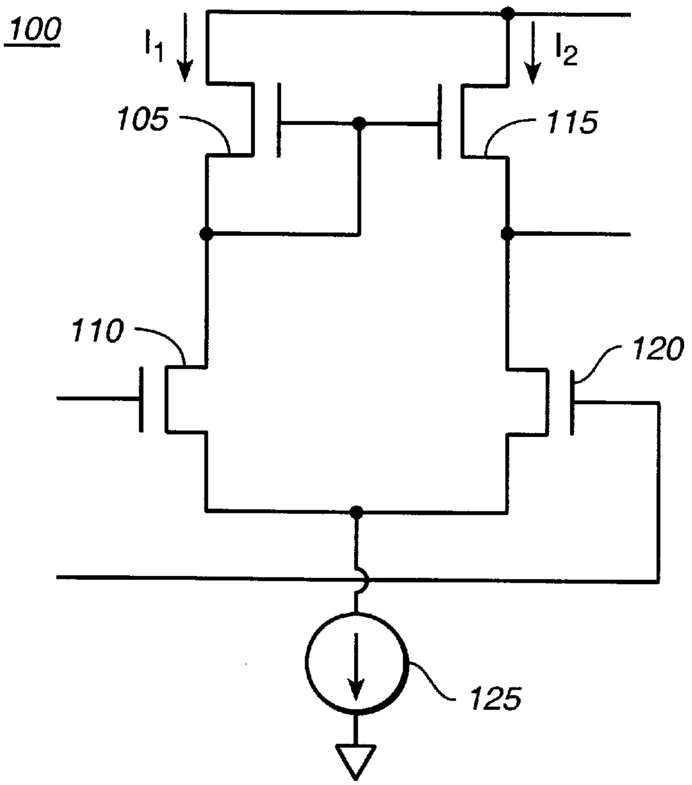
FIG. 1 (PRIOR ART)
FIG. 1 is a circuit diagram of a first embodiment of a current mirror according to the prior art.
Figure 2:
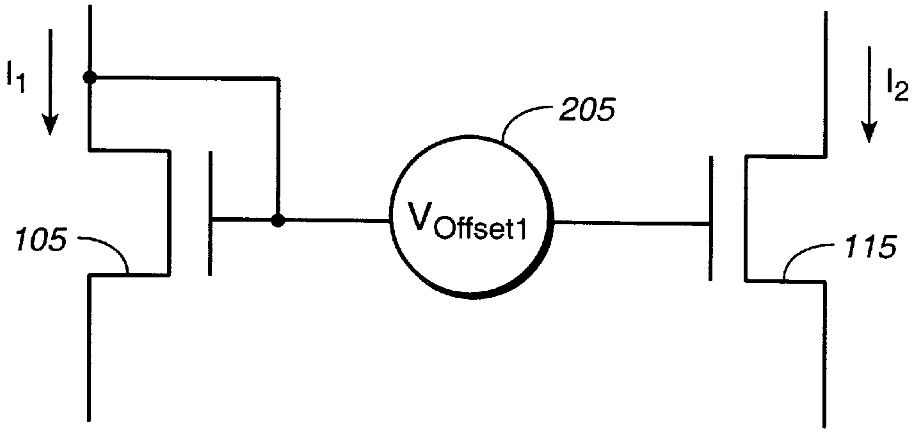
FIG. 2 (PRIOR ART)
FIG. 2 is a circuit diagram illustrating the offset voltage phenomenon according to the prior art.
Figure 3:
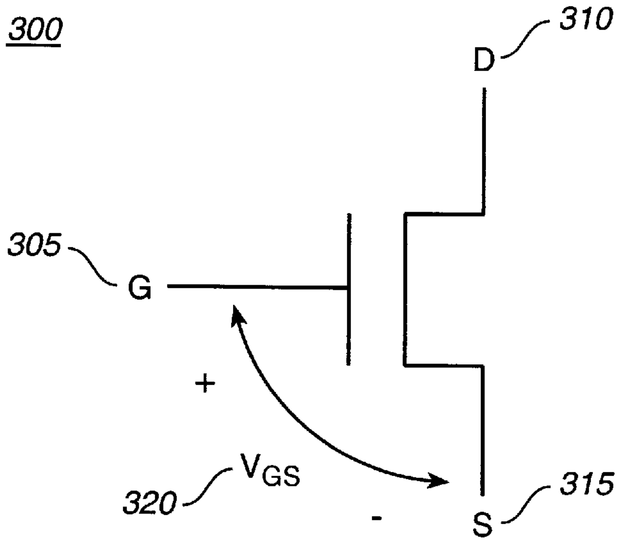
FIG. 3 (PRIOR ART)
FIG. 3 is an illustration of a symbol for a MOSFET.
Figure 4:
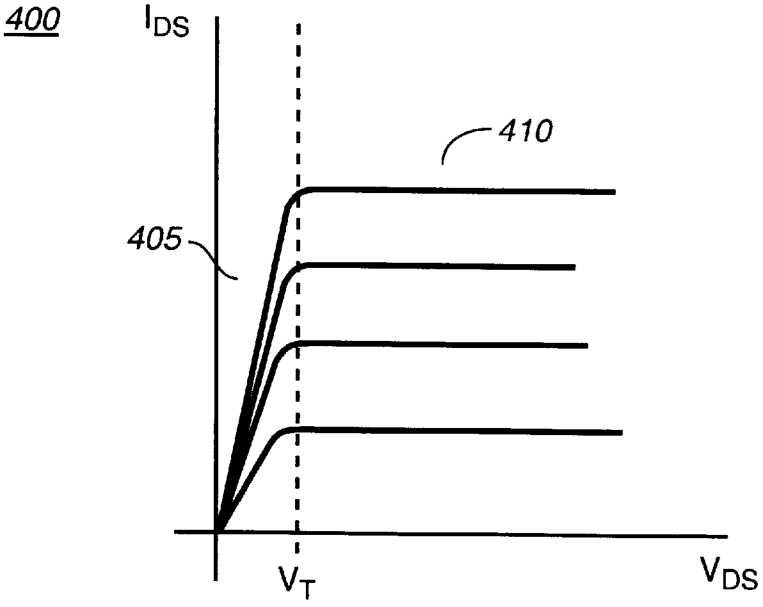
FIG. 4 (PRIOR ART)
FIG. 4 is a graph of a set of characteristic curves for a MOSFET.

Referring to FIG. 3, a MOSFET 300 has a gate 305, a drain 310, and a source 315. A gate-to-source voltage $V_{GS}$ 320 can be selected, within certain limits. Referring also to FIG. 4, the MOSFET 300 operates in accordance with a set of characteristic curves 400. The curves graphically represent the relationship between the MOSFET current $I_{DS}$ and the drain-to-source voltage $V_{DS}$. The chosen value of $V_{GS}$ 320 determines which characteristic curve is actually reflective of the operation of the MOSFET. However, all of the curves can be easily divided into two regions: a linear region 405 and a saturation region 410. The linear region, so named because the MOSFET current $I_{DS}$ varies linearly with the voltage $V_{DS}$, refers to the portions of the curves for which $V_{DS}$ is less than the threshold voltage $V_T$. The saturation region, for which $V_{DS}>V_T$, is so named because the MOSFET is "saturated", and the current will remain constant, no matter how high the voltage $V_{DS}$ becomes.

In general, a MOSFET will be operated in the saturation region. When operating in the saturation region, the MOSFET current $I_{DS}$ behaves according to the following relationship:

$$I_{DS}\,(V_{GS}-V_T-V_{offset})^2$$

$V_T$ and $V_{offset}$ remain constant as $V_{GS}$ is varied. Hence, the proportional effect of $V_{offset}$ can be reduced by increasing $V_{GS}$. However, if $V_{GS}$ is made too large, the MOSFET will break down.

In the linear region, the MOSFET current $I_{DS}$ behaves according to the following relationship:

$$I_{DS}\,(V_{GS}-V_T-V_{offset})$$

It is notable that because $I_{DS}$ varies directly with $V_{offset}$ rather than with the square of $V_{offset}$ operating in the linear region represents another way to reduce the effect of $V_{offset}$ upon the MOSFET current $I_{DS}$.

Figure 5:
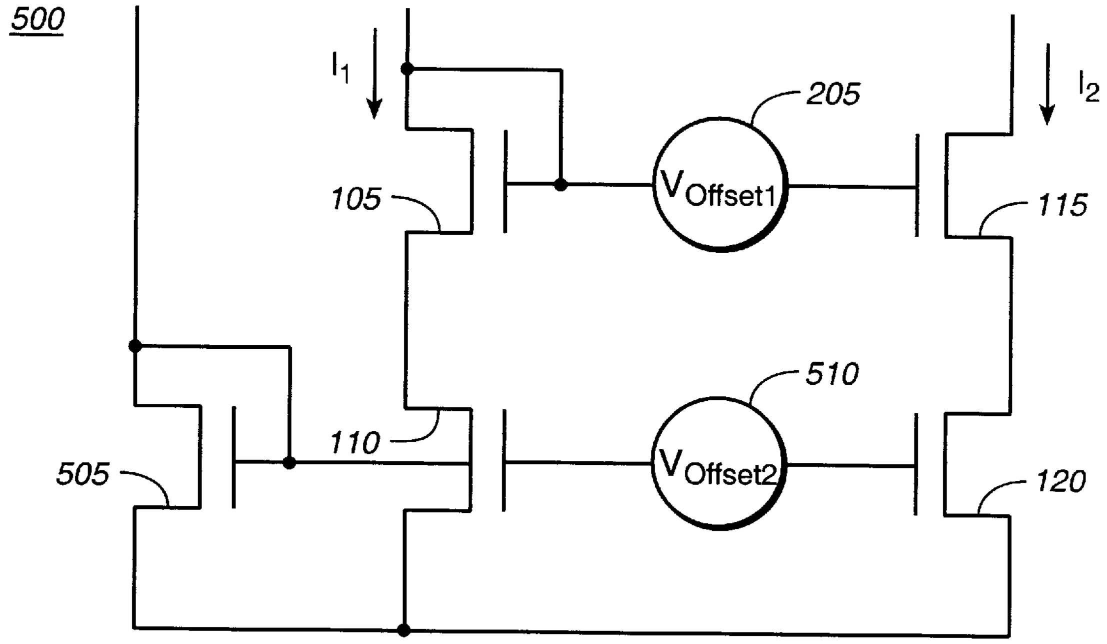
FIG. 5 is a circuit diagram of an embodiment of a current mirror according to the present invention.

Hence, an object of the present invention is to reduce the effect of $V_{offset}$ upon the MOSFET current $I_{DS}$ by simultaneously increasing $V_{GS}$ and operating in the linear region. Referring to FIG. 5, a circuit diagram for a current mirror 500 according to a preferred embodiment of the present invention illustrates a construction designed to achieve this objective. A fifth MOSFET 505 is connected to MOSFET 110. The purpose of MOSFET 505 is to bias MOSFET 110 by supplying it with a relatively high value of $V_{GS}$. It is noted that any voltage source may be used in lieu of MOSFET 505. The use of MOSFET 505 in FIG. 5 represents the preferred embodiment. Simultaneously, MOSFET 110 and MOSFET 120 are configured to operate in the linear region by choosing an appropriate operating point for the given value of $V_{GS}$. In other words, a value of $V_{DS}$ such that $V_{DS}<V_T$ is chosen. This allows the effect of $V_{offset2}$ 510 to be reduced both proportionally, due to the high value of $V_{GS}$, and by virtue of $I_{DS}$ (here, $I_1$) varying directly with $V_{offset2}$ 510 rather than with the square of $V_{offset2}$ 510.

Figure 6:
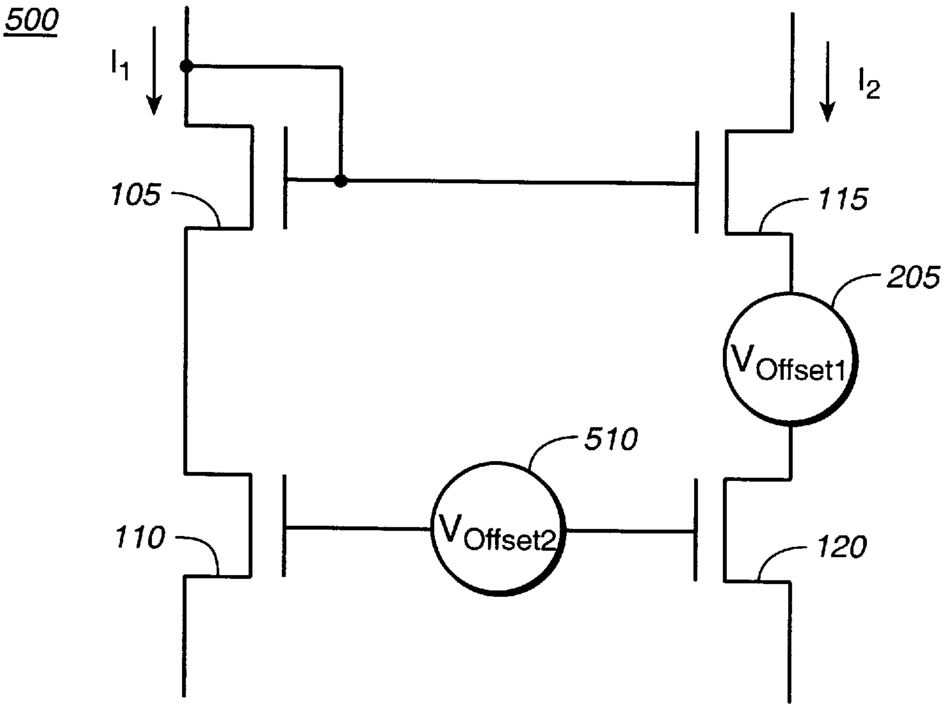
FIG. 6 is a circuit diagram illustrating the effect of reducing offset voltage in a current mirror according to the present invention.
Figure 7:
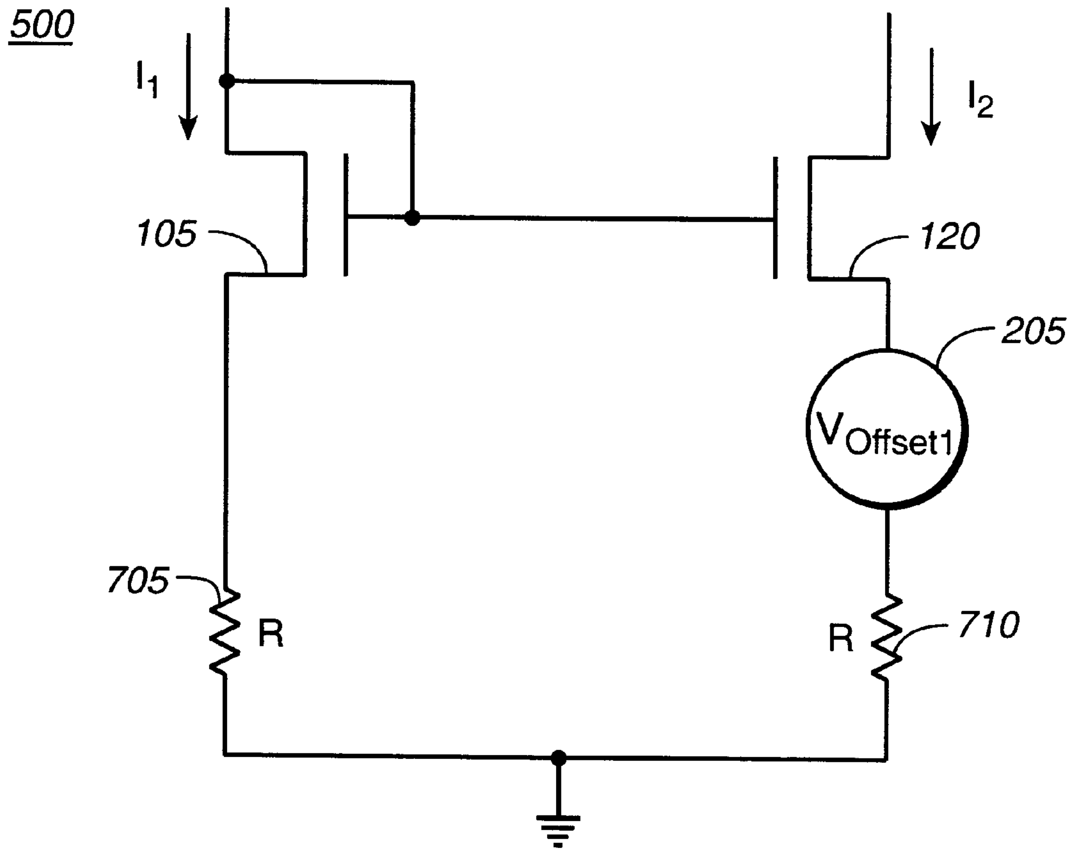
FIG. 7 is a circuit diagram further illustrating the effect of reducing offset voltage in a current mirror according to the present invention.

Referring to FIG. 6, the current mirror circuit 500 may be redrawn to allow $V_{offset1}$ 205 to be viewed as being serially connected between MOSFET 115 and MOSFET 120, by virtue of the linear-region operation of MOSFET 110 and MOSFET 120. Referring to FIG. 7, the circuit 500 may be viewed even more simply by recognizing that $V_{offset2}$ 510 has become negligible by comparison with $V_{offset1}$ 205 for purposes of equalizing the currents $I_1$ and $I_2$. Furthermore, the operation of MOSFET 110 and MOSFET 120 in the linear region allows these two MOSFETs to be viewed as effective resistors 705 and 710, respectively, because of the direct proportionality between the respective values of $I_{DS}$ and $V_{DS}$. It is seen in FIG. 7 that the current $I_1$passes through resistor 705, and the current $I_2$ passes through resistor 710, and the difference between the two respective voltage drops is equal to $V_{offset1}$ 205, which is a relatively small voltage difference. Therefore, the resistance values of resistor 705 and resistor 710 may be viewed as being approximately equal (hence these values are both referred to as R), because of the approximate equality of the currents $I_1$ and $I_2$ and the approximate equality of the voltage drop across the two resistors. By choosing a value of R such that $I_1$*R>>$V_{offset1}$, these approximations are made more accurate and the effect of $V_{offset1}$ can be minimized.

Normal operation of MOSFET 105 and MOSFET 115 will be in the saturation region. Therefore, the only way to directly reduce $V_{offset1}$ 205 is by reducing the transistor area. The transistor can be viewed as having two dimensions, a length L and a width W. The transistor area is the product of L and W, and the larger the area, the smaller the offset voltage $V_{offset1}$ 205. However, a larger transistor area also causes a large transistor capacitance, which has the direct effect of slowing the speed of the current mirror circuit 500.

The solution, found through empirical observation, is to choose a relatively large value of width W and a relatively small value of L, such that the product W*L is approximately 25% of that seen in the conventional current mirror. This choice allows the area to be large enough that $V_{offset1}$ 205 is sufficiently small and $I_1$, and $I_2$ are still approximately equal, while also improving system performance by reducing the capacitance of the circuit 500. It is noted that various values of W and L may be chosen to optimize performance. The best choices for W and L will depend upon the specific circuit configuration, the specific material characteristics of the MOSFETs used, and other factors.

Various equivalent embodiments of the present invention may be realized. For example, the described embodiment may be implemented in a read channel for a hard disk drive, or as a biasing element in a larger electrical circuit. As another example, the invention may be used as part of an operational amplifier or as part of an analog-to-digital converter. Any type of electrical circuitry that requires matching currents can take advantage of the methodology described herein.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be afforded the broadest interpretation so as to encompass all such modifications and equivalent structures and functions.

What is claimed is:

1. A current mirror, comprising:

a first MOSFET;

a second MOSFET, wherein said first and second MOSFETS are arranged as a current mirror;

a third MOSFET, wherein a source of said third MOSFET is in communication with a drain of said first MOSFET;

a fourth MOSFET, wherein a source of said fourth MOSFET is in communication with a drain of said second MOSFET;

a bias supply in communication with a gate of said third MOSFET and a gate of said fourth MOSFET, wherein said bias supply is configured to reduce an offset voltage between said third MOSFET and said fourth MOSFET by simultaneously operating the third and fourth MOSFETs in the linear region.

2. The current mirror of claim 1, wherein a length and a width of said first MOSFET and a length and a width of the second MOSFET are predetermined to reduce offset voltage between said first and second MOSFETS.

3. A read channel for a hard disk drive, comprising a current mirror, the current mirror comprising:

a first MOSFET;

a second MOSFET, wherein said first and second MOSFETS are arranged as a current mirror;

a third MOSFET, wherein a source of said third MOSFET is in communication with a drain of said first MOSFET;

a fourth MOSFET, wherein a source of said fourth MOSFET is in communication with a drain of said second MOSFET;

a bias supply in communication with a gate of said third MOSFET and a gate of said fourth MOSFET, wherein said bias supply is configured to reduce an offset voltage between said third MOSFET and said fourth MOSFET by simultaneously operating the third and fourth MOSFETs in the linear region.

4. The read channel of claim 3, wherein a length and a width of said first MOSFET and a length and a width of the second MOSFET are predetermined to reduce offset voltage between said first and second MOSFETS.

5. An electrical circuit for biasing an electrical component, the circuit comprising a current mirror, the current mirror comprising:

a first MOSFET;

a second MOSFET, wherein said first and second MOSFETS are arranged as a current mirror;

a third MOSFET, wherein a source of said third MOSFET is in communication with a drain of said first MOSFET;

a fourth MOSFET, wherein a source of said fourth MOSFET is in communication with a drain of said second MOSFET;

a bias supply in communication with a gate of said third MOSFET and a gate of said fourth MOSFET, wherein said bias supply is configured to reduce an offset voltage between said third MOSFET and said fourth MOSFET by simultaneously operating the third and fourth MOSFETs in the linear region.

6. The electrical circuit of claim 5, wherein a length and a width of said first MOSFET and a length and a width of the second MOSFET are predetermined to reduce offset voltage between said first and second MOSFETS.

7. An electrical circuit for converting an analog input signal into a digital output signal, the circuit comprising a current mirror, the current mirror comprising:

a first MOSFET;

a second MOSFET, wherein said first and second MOSFETS are arranged as a current mirror;

a third MOSFET, wherein a source of said third MOSFET is in communication with a drain of said first MOSFET;

a fourth MOSFET, wherein a source of said fourth MOSFET is in communication with a drain of said second MOSFET;

a bias supply in communication with a gate of said third MOSFET and a gate of said fourth MOSFET, wherein said bias supply is configured to reduce an offset voltage between said third MOSFET and said fourth MOSFET by simultaneously operating the third and fourth MOSFETs in the linear region.

8. The electrical circuit of claim 7, wherein a length and a width of said first MOSFET and a length and a width of the second MOSFET are predetermined to reduce offset voltage between said first and second MOSFETS.

9. An operational amplifier, comprising a current mirror, the current mirror comprising:

a first MOSFET;

a second MOSFET, wherein said first and second MOSFETS are arranged as a current mirror;

a third MOSFET, wherein a source of said third MOSFET is in communication with a drain of said first MOSFET;

a fourth MOSFET, wherein a source of said fourth MOSFET is in communication with a drain of said second MOSFET;

a bias supply in communication with a gate of said third MOSFET and a gate of said fourth MOSFET, wherein said bias supply is configured to reduce an offset voltage between said third MOSFET and said fourth MOSFET by simultaneously operating the third and fourth MOSFETs in the linear region.

10. The operational amplifier of claim 9, wherein a length and a width of said first MOSFET and a length and a width of the second MOSFET are predetermined to reduce offset voltage between said first and second MOSFETS.

11. An apparatus for optimizing the performance of a current mirror circuit, the apparatus comprising:

a first FET;

a second FET, wherein said first and second FETS are arranged as a current mirror;

a third FET, wherein a source of said third FET is in communication with a drain of said first FET;

a fourth FET, wherein a source of said fourth FET is in communication with a drain of said second FET;

a bias a bias supply in communication with a gate of said third FET and a gate of said fourth FET, wherein said bias supply is configured to reduce an offset voltage between said third FET and said fourth FET by simultaneously operating the third and fourth FETs in the linear region.

12. The apparatus of claim 11, wherein each FET is a MOSFET.

13. The apparatus of claim 12, wherein each MOSFET is manufactured using CMOS technology.

14. The apparatus of claim 11, wherein a length and a width of said first FET and a length and a width of the second FET are predetermined to reduce offset voltage between said first and second FETS.

15. The apparatus of claim 14, wherein each FET is a MOSFET.

16. The apparatus of claim 15, wherein each MOSFET is manufactured using CMOS technology.

17. A method for using at least two pairs of MOSFETs as a current mirror, each MOSFET having a set of operating characteristic curves, each curve having a linear region and a saturation region, the method comprising the steps of:

configuring first and second MOSFETS as a current mirror;

configuring a source of a third MOSFET in communication with a drain of said first MOSFET;

configuring a source of a fourth MOSFET in communication with a drain of said second MOSFET;

applying a bias voltage to gates of said third and fourth MOSFETS to reduce an offset voltage between said third MOSFET and said fourth MOSFET by simultaneously operating the third and fourth MOSFETs in the linear region.

18. The method of claim 17, further comprising the step selecting a length a width of said first and second MOSFETS to reduce an offset voltage between said first and second MOSFETS.

19. A current mirror, comprising:

a first MOSFET;

a second MOSFET, wherein said first and second MOSFETS are arranged as a current mirror;

a third MOSFET, wherein a source of said third MOSFET is in communication with a drain of said first MOSFET;

a fourth MOSFET, wherein a source of said fourth MOSFET is in communication with a drain of said second MOSFET;

a bias supply in communication with a gate of said third MOSFET and a gate of said fourth MOSFET, wherein said bias supply is configured to reduce an offset voltage between said third MOSFET and said fourth MOSFET by simultaneously operating the third and fourth MOSFETs in the linear region, wherein said first, second, third and fourth MOSFETs comprise the same conductivity type.

20. A read channel for a hard disk drive, comprising a current mirror, the current mirror comprising:

a first MOSFET;

a second MOSFET, wherein said first and second MOSFETS are arranged as a current mirror;

a third MOSFET, wherein a source of said third MOSFET is in communication with a drain of said first MOSFET;

a fourth MOSFET, wherein a source of said fourth MOSFET is in communication with a drain of said second MOSFET;

a bias supply in communication with a gate of said third MOSFET and a gate of said fourth MOSFET, wherein said bias supply is configured to reduce an offset voltage between said third MOSFET and said fourth MOSFET by simultaneously operating the third and fourth MOSFETs in the linear region, wherein said first, second, third and fourth MOSFETs comprise the same conductivity type.

21. An electrical circuit for biasing an electrical component, the circuit comprising a current mirror, the current mirror comprising:

a first MOSFET;

a second MOSFET, wherein said first and second MOSFETS are arranged as a current mirror;

a third MOSFET, wherein a source of said third MOSFET is in communication with a drain of said first MOSFET;

a fourth MOSFET, wherein a source of said fourth MOSFET is in communication with a drain of said second MOSFET;

a bias supply in communication with a gate of said third MOSFET and a gate of said fourth MOSFET, wherein said bias supply is configured to reduce an offset voltage between said third MOSFET and said fourth MOSFET by simultaneously operating the third and fourth MOSFETs in the linear region, wherein said first, second, third and fourth MOSFETs comprise the same conductivity type.

22. An electrical circuit for converting an analog input signal into a digital output signal, the circuit comprising a current mirror, the current mirror comprising:

a first MOSFET;

a second MOSFET, wherein said first and second MOSFETS are arranged as a current mirror;

a third MOSFET, wherein a source of said third MOSFET is in communication with a drain of said first MOSFET;

a fourth MOSFET, wherein a source of said fourth MOSFET is in communication with a drain of said second MOSFET;

a bias supply in communication with a gate of said third MOSFET and a gate of said fourth MOSFET, wherein said bias supply is configured to reduce an offset voltage between said third MOSFET and said fourth MOSFET by simultaneously operating the third and fourth MOSFETs in the linear region, wherein said first, second, third and fourth MOSFETs comprise the same conductivity type.

23. An operational amplifier, comprising a current mirror, the current mirror comprising:

a first MOSFET;

a second MOSFET, wherein said first and second MOSFETS are arranged as a current mirror;

a third MOSFET, wherein a source of said third MOSFET is in communication with a drain of said first MOSFET;

a fourth MOSFET, wherein a source of said fourth MOSFET is in communication with a drain of said second MOSFET;

a bias supply in communication with a gate of said third MOSFET and a gate of said fourth MOSFET, wherein said bias supply is configured to reduce an offset voltage between said third MOSFET and said fourth MOSFET by simultaneously operating the third and fourth MOSFETs in the linear region, wherein said first, second, third and fourth MOSFETs comprise the same conductivity type.

24. An apparatus for optimizing the performance of a current mirror circuit, the apparatus comprising:

a first FET;

a second FET, wherein said first and second FETS are arranged as a current mirror;

a third FET, wherein a source of said third FET is in communication with a drain of said first FET;

a fourth FET, wherein a source of said fourth FET is in communication with a drain of said second FET;

a bias a bias supply in communication with a gate of said third FET and a gate of said fourth FET, wherein said bias supply is configured to reduce an offset voltage between said third FET and said fourth FET by simultaneously operating the third and fourth FETs in the linear region, wherein said first, second, third and fourth MOSFETs comprise the same conductivity type.

25. A method for using at least two pairs of MOSFETs as a current mirror, each MOSFET having a set of operating characteristic curves, each curve having a linear region and a saturation region, the method comprising the steps of:

configuring first and second MOSFETS as a current mirror;

configuring a source of a third MOSFET in communication with a drain of said first MOSFET;

configuring a source of a fourth MOSFET in communication with a drain of said second MOSFET, selecting the first, second, third and fourth MOSFETs to have the same conductivity type;

applying a bias voltage to gates of said third and fourth MOSFETS to reduce an offset voltage between said third MOSFET and said fourth MOSFET by simultaneously operating the third and fourth MOSFETs in the linear region.

* * * * *